United States Patent [19]
How

[11] Patent Number: 5,408,502
[45] Date of Patent: Apr. 18, 1995

[54] APPARATUS AND METHOD FOR COMMUNICATING DIGITAL DATA USING TRELLIS CODED QAM WITH PUNCTURED CONVOLUTIONAL CODES

[75] Inventor: Stephen K. How, La Jolla, Calif.

[73] Assignee: General Instrument Corporation, Hatboro, Pa.

[21] Appl. No.: 912,542

[22] Filed: Jul. 13, 1992

[51] Int. Cl.$^6$ .................. H03D 1/00; H04L 27/06; G06F 11/10; H03M 13/12
[52] U.S. Cl. .................................. 375/340; 371/43
[58] Field of Search ............... 371/43; 375/94, 39, 375/38

[56] References Cited

U.S. PATENT DOCUMENTS

| | | | |
|---|---|---|---|
| 5,113,401 | 5/1992 | Chevillat et al. | 371/43 |
| 5,233,629 | 8/1993 | Paik et al. | 371/43 |

OTHER PUBLICATIONS

J. Cain et al., "Punctured Convolutional Codes of Rate (n−1)/n and Simplified Maximum Likelihood Decoding", IEEE Trans. Info. Theory, vol. IT-25, pp. 97–100, Jan. 1979.

Y. Yasuda et al., "High-Rate Punctured Convolutional Codes for Soft Decision Viterbi Decoding", IEEE Trans. on Comm., vol. COM-32, pp. 315–319, Mar. 1984.

*Primary Examiner*—Stephen Chin
*Assistant Examiner*—Duane Kobayashi
*Attorney, Agent, or Firm*—Barry R. Lipsitz

[57] ABSTRACT

Digital data is communicated using trellis coded QAM. Symbols are coded for transmission using a rate ½ convolutional encoder punctured to rate ⅔. The coded symbols are transmitted for receipt at a receiver. At the receiver, two sets of branch metrics are computed for each received symbol. The received symbols are decoded by using the branch metrics to effect two passes through a modified rate ½ Viterbi decoder for each symbol.

21 Claims, 8 Drawing Sheets

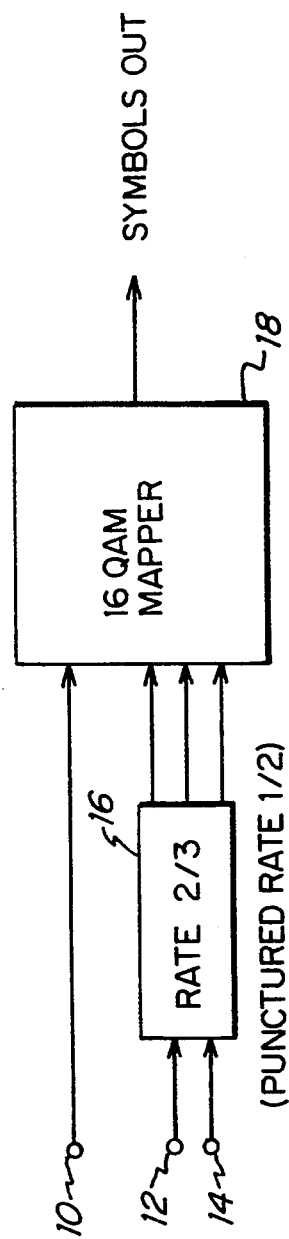
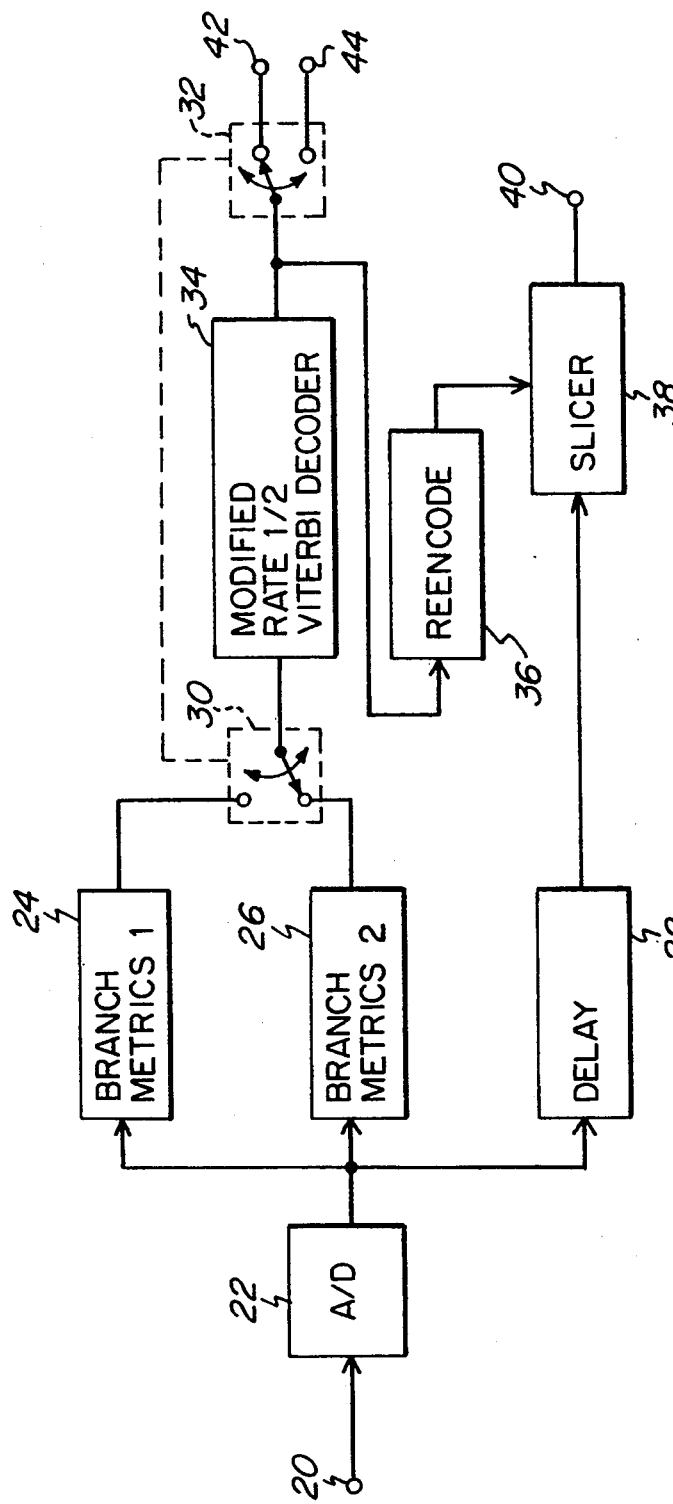

APPARATUS AND METHOD FOR COMMUNICATING DIGITAL DATA USING TRELLIS CODED QAM WITH PUNCTURED CONVOLUTIONAL CODES

BACKGROUND OF THE INVENTION

The present invention relates to trellis coded quadrature amplitude modulation (QAM) and more particularly to the communication of digital data using a trellis coding algorithm implemented with punctured convolutional codes.

Digital data, for example, digitized video for use in broadcasting high definition television (HDTV) signals, can be transmitted over terrestrial or cable VHF or UHF analog channels for communication to end users. Analog channels deliver corrupted and transformed versions of their input waveforms. Corruption of the waveform, usually statistical, may be additive and/or multiplicative, because of possible background thermal noise, impulse noise, and fades. Transformations performed by the channel are frequency translation, nonlinear or harmonic distortion and time dispersion.

In order to communicate digital data via an analog channel, the data is modulated using, for example, a form of pulse amplitude modulation (PAM). Typically, quadrature amplitude modulation is used to increase the amount of data that can be transmitted within an available channel bandwidth. QAM is a form of PAM in which a plurality of bits of information are transmitted together in a pattern referred to as a "constellation" that can contain, for example, 16 or 32 points.

In pulse amplitude modulation, each signal is a pulse whose amplitude level is determined by a transmitted symbol. In 16 bit QAM, scaled symbol amplitudes of $-3$, $-1$, 1 and 3 in each quadrature channel are typically used. Bandwidth efficiency in digital communication systems is defined as the number of transmitted bits per second per unit of bandwidth, i.e., the ratio of the data rate to the bandwidth. Modulation systems with high bandwidth efficiency are employed in applications that have high data rates and small bandwidth occupancy requirements. QAM provides bandwidth efficient modulation.

Trellis coded modulation (TCM) has evolved as a combined coding and modulation technique for digital transmission over band limited channels. It allows the achievement of significant coding gains over conventional uncoded multilevel modulation, such as QAM, without compromising bandwidth efficiency. TCM schemes utilize redundant nonbinary modulation in combination with a finite-state encoder which governs the selection of modulation signals to generate coded signal sequences. In the receiver, the noisy signals are decoded by a soft decision maximum likelihood frequency decoder. Such schemes can improve the robustness of digital transmission against additive noise by 3–6 dB or more, compared to conventional uncodedmodulation. These gains are obtained without bandwidth expansion or reduction of the effective information rate as required by other known error correction schemes. The term "trellis" is used because these schemes can be described by a state-transition (trellis) diagram similar to the trellis diagrams of binary convolutional codes. The difference is that TCM extends the principles of convolutional encoding to nonbinary modulation with signal sets of arbitrary size.

One application in which a practical solution is necessary for communicating digital data is the digital communication of compressed high definition television signals. Systems for transmitting compressed HDTV signals have data rate requirements on the order of 15–20 megabits per second (Mbps), bandwidth occupancy requirements on the order of 5–6 MHz (the bandwidth of a conventional National Television System Committee (NTSC) television channel), and very high data reliability requirements (i.e., a very small bit error rate). The data rate requirement arises from the need to provide a high quality compressed television picture. The bandwidth constraint is a consequence of the U.S. Federal Communications Commission requirement that HDTV signals occupy existing 6 MHz television channels, and must coexist with the current broadcast NTSC signals. This combination of data rate and bandwidth occupancy requires a modulation system that has high bandwidth efficiency. Indeed, the ratio of data rate to bandwidth must be on the order of 3 or 4.

The requirement for a very high data reliability in the HDTV application results from the fact that highly compressed source material (i.e., the compressed video) is intolerant of channel errors. The natural redundancy of the signal has been removed in order to obtain a concise description of the intrinsic value of the data. For example, for a system to transmit at 15 Mbps for a twenty-four hour period, with less than one bit error, requires the bit error rate (BER) of the system to be less than one error in $10^{12}$ transmitted bits.

Data reliability requirements are often met in practice via the use of a concatenated coding approach, which is a divide and concur approach to problem solving. In such a coding framework, two codes are employed. An "inner" modulation code cleans up the channel and delivers a modest symbol error rate to an "outer" decoder. The inner code is usually a coded modulation that can be effectively decoded using "soft decisions" (i.e., finely quantized channel data). A known approach is to use a convolutional or trellis code as the inner code with some form of the "Viterbi algorithm" as a trellis decoder. The outer code is most often a t-error-correcting, "Reed-Solomon" code. The outer decoder removes the vast majority of symbol errors that have eluded the inner decoder in such a way that the final output error rate is extremely small.

A more detailed explanation of concatenated coding schemes can be found in G. C. Clark, Jr. and J. B. Cain, "Error-Correction Coding for Digital Communications", Plenum Press, New York, 1981; and S. Lin and D. J. Costello, Jr., "Error Control Coding: Fundamentals and Applications", Prentice-Hall, Englewood Cliffs, N.J., 1983. Trellis, coding is discussed extensively in G. Ungerboeck, "Channel Coding with Multilevel/Phase Signals", *IEEE Transactions on Information Theory*, Vol. IT-28, No. 1, pp. 55–67, January 1982; G. Ungerboeck, "Trellis-Coded Modulation with Redundant Signal Sets—Part I: Introduction,—Part II: State of the Art", *IEEE Communications Magazine*, Vol. 25, No. 2, pp. 5–21, February 1987; and A. R. Caulderbank and N.J. A. Sloane, "New Trellis Codes Based on Lattices and Cosets", *IEEE Transactions on Information Theory*, Vol. IT-33, No. 2, pp. 177–195, March 1987. The Viterbi algorithm is explained in G. D. Forney, Jr., "The Viterbi Algorithm", *Proceedings of the IEEE*, Vol. 61, No. 3, March 1973. Reed-Solomon coding systems are discussed in the Clark, Jr. et al and Lin et al articles cited above.

Although the use of a concatenated coding scheme will improve data reliability as noted above, the implementation of such schemes is somewhat cumbersome in view of the need to provide both an inner code and an outer code, each having separate hardware and software components at both the transmitter end (encoder) and receiver end (decoder) of a communication system. It would be advantageous to provide a data modulation system with high bandwidth efficiency and a low error rate that does not require the use of both an inner and outer code, or to at least provide a simpler outer code. The complexity of a transmitter and receiver for use with such a scheme should be minimized, to provide low cost in volume production.

It would be further advantageous to provide a data modulation system that overcomes the usual difficulties of implementing a rate $\frac{2}{3}$ Viterbi decoder. In particular, such decoders typically require complicated "add compare select" (ACS) units and interconnects. Provision of such a system having a coding gain comparable to that of the class $\nu=6$ Ungerboeck code would be particularly advantageous.

The present invention provides a modulation system having the aforementioned advantages. In particular, the method and apparatus of the present invention provide a trellis coding scheme which uses a punctured convolutional code to achieve high coding gains for high code rates with a simple implementation. Specifically, a 3 bit/baud trellis code using 16 QAM is disclosed which is easily extended to a 32 QAM constellation to provide a 4 bit/baud code. This scheme can be implemented with minimal hardware changes to existing trellis coding and decoding systems.

SUMMARY OF THE INVENTION

The present invention provides a method for communicating digital data using trellis coded QAM. Symbols are coded for transmission using a rate $\frac{1}{2}$ convolutional encoder punctured to rate $\frac{2}{3}$. The coded symbols are transmitted, and received at a receiver. At the receiver, two sets of branch metrics are computed for each received symbol. The received symbols are decoded by using the branch metrics to effect two passes through a modified rate $\frac{1}{2}$ Viterbi decoder for each symbol.

The symbols can be coded on the basis of groups forming an 8-way partition of a QAM constellation. Each group contains a different two-point subset of a 16 QAM constellation, and the two points in each group are separated by a distance of $2\sqrt{2}\Delta_0$, where $\Delta_0$ is the spacing between adjacent points in the full constellation. The same spacing would be provided for the uncoded bits in a 32 QAM embodiment. Three coded bits are transmitted by selecting a symbol group wherein the specific symbol within the group selects an uncoded bit (16 QAM) or two bits (32 QAM) to be transmitted. The eight groups partition a 16 QAM constellation into subsets of two symbols each.

The received symbols define received points that correspond to but may be offset from transmitted QAM constellation points due to transmission errors. The first set of branch metrics indicates the distances between a received point and the closest actual QAM constellation point in each of a first plurality of predetermined subsets of the constellation points. The second set of branch metrics indicates the distances between the received point and the closest actual QAM constellation point in each of a second plurality of predetermined subsets of the constellation points.

In a generalized embodiment, the symbols are coded on the basis of eight different groups of constellation points forming an 8-way partition of a QAM constellation. Each group is identifiable by a 3-bit binary number, or corresponding letter A–H assigned in alphabetic-numeric order. The partition groups are mapped to binary labels based on Euclidean distances between points of the groups and the structure of the rate $\frac{2}{3}$ convolutional code. A first group is arbitrarily labeled A or 000. The group with both points $2\Delta_0$ distant from elements of A is labeled H (111). The two groups with points $\sqrt{2}\Delta_0$ distant from the points in A are labeled B (001) and G (110). Of the four remaining groups, one is arbitrarily labeled C (010). The group with points $2\Delta_0$ distant from the elements of C is labeled F (101). The two groups with points $\sqrt{2}\Delta_0$ distant from the points in C are labeled D (011) and E (100). The first plurality of predetermined subsets comprise the unions of groups AUB, HUG, CUD, and FUE. The second plurality of predetermined subsets comprise the unions of groups AUG, CUE, HUB, and FUD.

A method is provided for decoding received convolutionally encoded symbols. Two sets of branch metrics are computed for each received symbol. The received symbols are decoded by using the branch metrics to effect two passes through a modified rate $\frac{1}{2}$ Viterbi decoder for each symbol. These symbols were coded at the transmitter on the basis of groups of the 8-way partition of a QAM constellation. An uncoded bit is identified from each symbol by the position of the transmitted constellation point within a group. In an illustrated embodiment, the received symbols define received points that correspond to but may be offset from transmitted QAM constellation points due to transmission errors. The first set of branch metrics indicates the distances between a received point and the closest actual QAM constellation point in each of a first plurality of predetermined subsets of the constellation points. The second set of branch metrics indicates the distances between the received point and the closest actual QAM constellation point in each of a second plurality of predetermined subsets of the constellation points. The predetermined subsets of constellation points comprise the unions of different groups as indicated in the generalized description set forth above.

Apparatus is provided for encoding digital QAM data for communication to a receiver. Symbols representative of QAM constellation points are coded for transmission using a rate $\frac{1}{2}$ convolutional encoder punctured to rate $\frac{2}{3}$. The coded symbols are transmitted to a receiver. At the receiver, two sets of branch metrics are computed for each received symbol. The received symbols are decoded by using the branch metrics to effect two passes through a modified rate $\frac{1}{2}$ Viterbi decoder for each symbol. In an illustrated embodiment, the symbols are coded on the basis of groups forming an 8-way partition of a QAM constellation. An uncoded bit is transmitted within each symbol by selecting the position of the transmitted constellation point within a group. For a 16 QAM embodiment, the groups consist of eight two-point subsets of the full QAM constellation, with the two points in each group separated by a distance of $2\sqrt{2}\Delta_0$, where $\Delta_0$ is the spacing between adjacent points in the full constellation.

Apparatus for decoding received convolutionally encoded symbols in accordance with the present invention includes means for computing two sets of branch metrics for each received symbol. Means responsive to the branch metrics decode the received symbols by effecting a first pass through a modified rate $\frac{1}{2}$ Viterbi decoder for each symbol in accordance with the first set of branch metrics for the symbol and a second pass through the decoder for each symbol in accordance with the second set of branch metrics for the symbol. (These symbols were coded at the transmitter on the basis of groups forming an 8-way partition of a QAM constellation.) An uncoded bit can be received with each received symbol by identifying the position within the group of a transmitted constellation point represented by the symbol.

BRIEF DESCRIPTION OF THE DRAWINGS

FIG. 1 is a block diagram of an encoder in accordance with the present invention;

FIG. 2 is a block diagram of a decoder in accordance with the present invention;

DETAILED DESCRIPTION OF THE INVENTION

The present invention provides a trellis coding scheme that uses a punctured convolutional code to achieve high coding gains for high code rates with a simple implementation. A modified rate $\frac{1}{2}$ Viterbi decoder is used at the receiver, with inserted branch erasures to decode a rate $\frac{2}{3}$ punctured code. Two sets of branch metrics are computed for each received symbol, and two decoded bits are generated by using two steps through the Viterbi decoder for each received symbol. The first set of branch metrics is used for the first pass through the Viterbi decoder and the second set of branch metrics is used for the second pass.

FIG. 1 is a block diagram illustrating an encoder in accordance with the present invention. An uncoded bit is input to a 16 QAM mapper 18 via an input terminal 10. Two bits to be encoded into three bits are input at terminals 12 and 14, respectively, to a rate $\frac{2}{3}$ convolutional encoder 16. The rate $\frac{2}{3}$ encoder uses a rate $\frac{1}{2}$ convolutional code punctured to rate $\frac{2}{3}$. The technique of puncturing is well known in the art, and is explained in detail in J. B. Cain, G. C. Clark, Jr., and J. M. Geist, "Punctured Convolutional Codes of Rate (n−1)/n and Simplified Maximum Likelihood Decoding," *IEEE Trans. Info. Theory*, Vol. IT-25, pp. 97–100, January 1979, and Y. Yasuta, K. Kashusi, and Y. Hirata, "High-Rate Punctured Convolutional Codes for Soft Decision Viterbi Decoding," *IEEE Trans. on Commun.*, Vol. COM-32, pp. 315–319, March 1984. In the puncturing technique, a fraction of the symbols generated by a rate $\frac{1}{2}$ code is deleted. At the decoder, the deleted symbols are replaced by erasures. One use of the puncturing technique is to permit a single basic code to be used for both power-limited and bandwidth-limited channels. A major advantage of puncturing is that high code rates n−1/n can be employed, and be decoded with practical rate 1/n decoders with only modifications in the branch metric generators, where erasures are inserted for the branch punctures.

Figure 3:
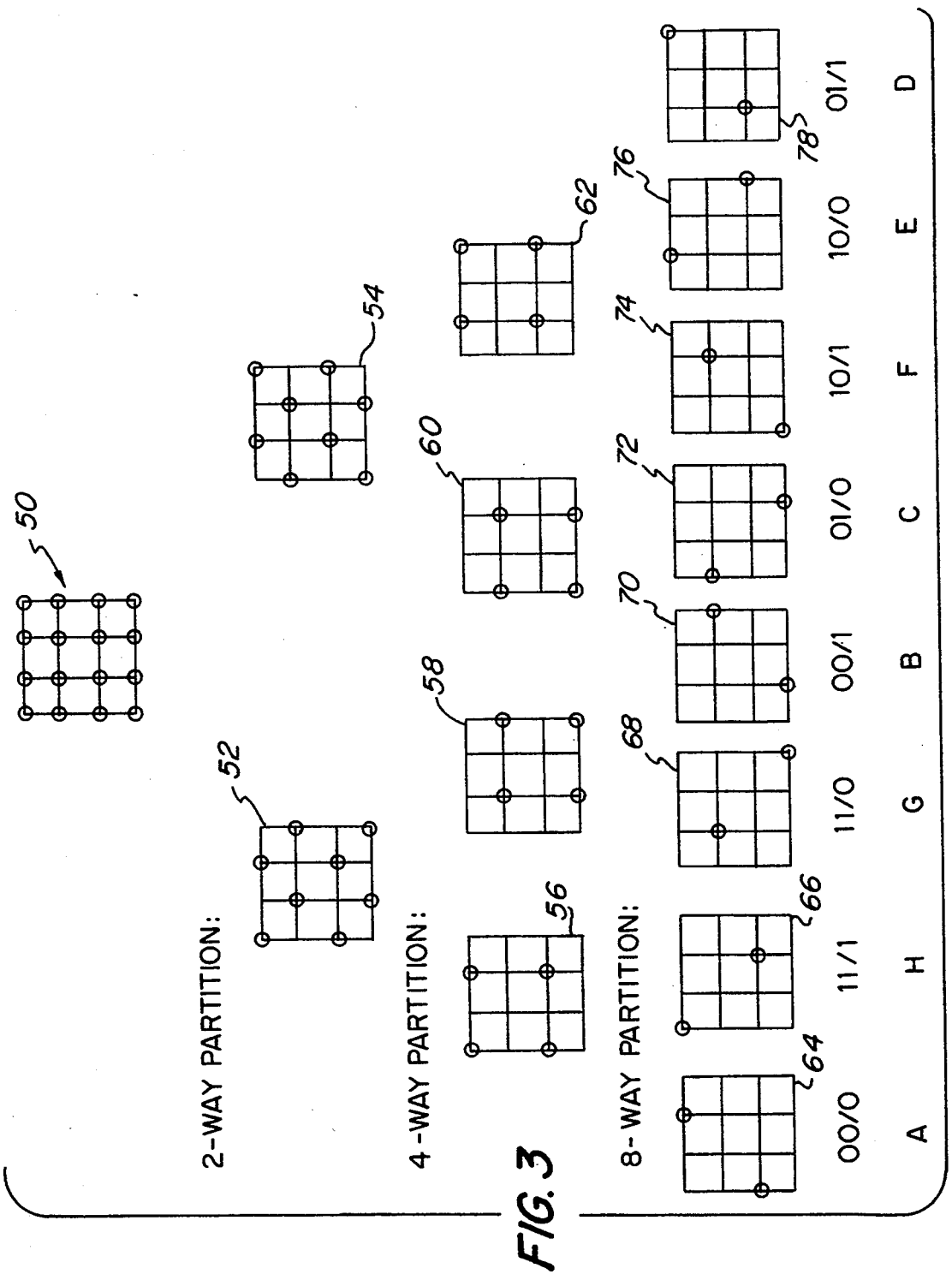
FIG. 3 is a graphic representation of a 16 QAM constellation pattern and successive partitioning into groups with maximum intra-symbol spacing.
Figure 5:
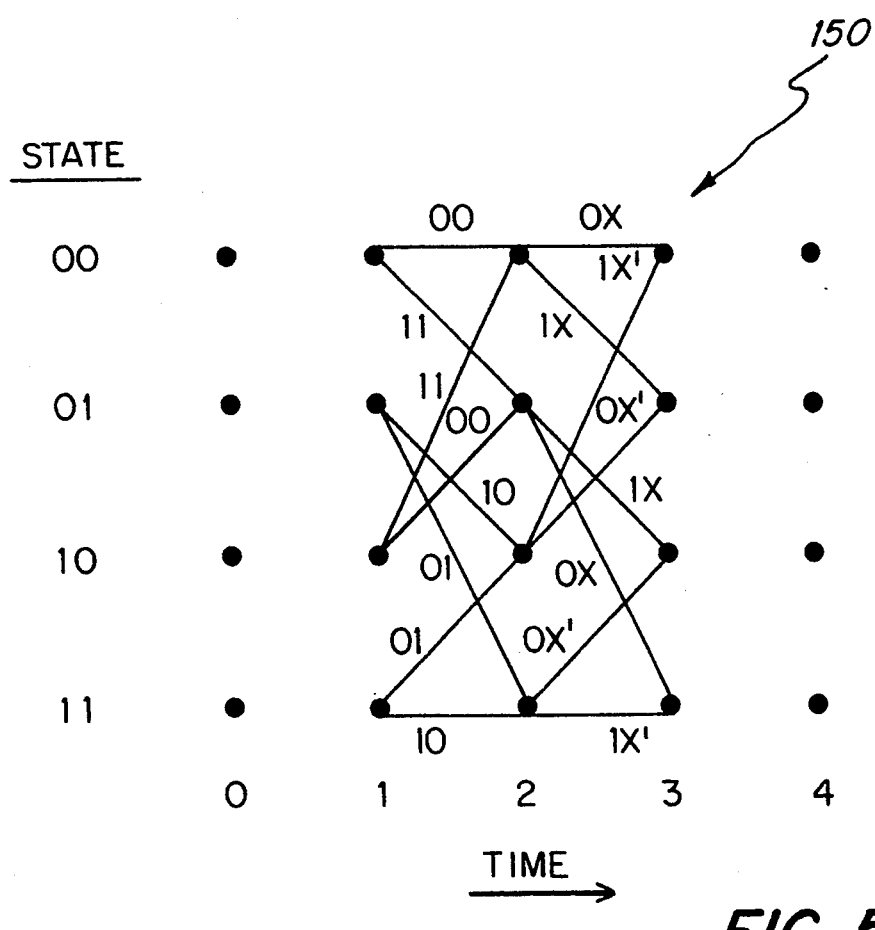
FIG. 5 is an illustration of a punctured rate $\frac{1}{2}$, $\nu=2$ trellis equivalent to a rate $\frac{2}{3}$ trellis.

In the punctured encoder 16 of the present invention, two source bits are encoded into three, for input to QAM mapper 18, and a third source bit (input at terminal 10) is used uncoded. The three source bits determine one-of-eight groups, as shown in the partition of FIG. 3 and explained in greater detail below. The uncoded bit determines the position within each of the eight groups 64, 66, 68, 70, 72, 74, 76, 78 (FIG. 3). This symbol generation is equivalent to standard trellis coding except that the convolutional encoder is punctured. A simple example of the equivalent rate $\frac{1}{2}$ punctured trellis 150 is illustrated in FIG. 5, for $\nu=2$. In accordance with the present invention, the three-bit branch of the rate $\frac{2}{3}$ code traverses two steps through the punctured trellis 150.

At the encoder of FIG. 1, 16 QAM mapper 18 maps the four input bits (three coded, one uncoded) into symbols for transmission over a communication channel to a receiver. Such mappers are well known in the art, and examples are given, for example, in G. Ungerboeck, "Trellis-Coded Modulation with Redundant Signal Sets,—Part 1: Introduction,—Part 2: State of the Art," *IEEE Communications Magazine*, Vol. 25, No. 2, pp. 5–21, February 1987. A specific mapping algorithm that can be used with the present invention is discussed below in connection with FIGS. 3 and 4.

A decoder in accordance with the present invention is illustrated in block diagram form in FIG. 2. Received symbols are input at a terminal 20 to an analog to digital converter 22. The received symbols are decoded into two sets of branch metrics by decoders 24 and 26. The first set of branch metrics represents the probability that an unpunctured branch identified by two coded bits 00, 01, 10, or 11 has been received. The second set of branch metrics represents the probability that a punctured branch represented by the third coded bit 0X or 1X has been received. The branch notation is discussed below in connection with FIG. 3.

In order to provide a rate $\frac{2}{3}$ operation from a rate $\frac{1}{2}$ Viterbi decoder, a rate $\frac{1}{2}$ Viterbi decoder 34 is accessed twice for each received symbol identifying 3 coded bits. The first pass through the Viterbi decoder utilizes the first set of branch metrics from branch metric computer 24. A switch 30 couples the first set of branch metrics to the Viterbi decoder 34 during the first pass. The second pass through the Viterbi decoder utilizes the second set of branch metrics from branch metric computer 26. Again, switch 30 inputs the appropriate branch metrics to the Viterbi decoder 34. A corresponding switch 32 with the output of the Viterbi decoder provides the decoded bit resulting from the first pass through the decoder on an output terminal 42, and the decoded bit resulting from the second pass through the decoder on an output terminal 44. These two bits correspond to the two source bits that were input to the convolutional encoder 16 via terminals 12, 14 at the encoder of FIG. 1.

In order to recover the uncoded bit that was input at terminal 10 of the encoder (FIG. 1), the bits output from Viterbi decoder 34 are re-encoded at a re-encoder 36 that duplicates the function of the encoder illustrated in FIG. 1. The re-encoded bits are input to a slicer 38, which receives the output of analog to digital converter 22 delayed by an appropriate time period in a delay circuit 28. The delay provided is equal to the amount of time that it takes the decoder to produce the decoded bits at the output of Viterbi decoder 34 from the time the symbols are received at the output of analog to digital converter 22.

FIG. 3 illustrates the partitioning of a 16 QAM constellation pattern 50 in accordance with the present invention. As indicated at 50, the original constellation includes 16 points. These points are divided into two groups of eight (52, 54) such that the minimum spacing of the symbols in the new groups is $\sqrt{2}$ larger than the original group. The two sets of eight are each partitioned as in the manner above to create a 4-way partition of the 16 constellation points. These are shown as groups 56, 58, 60, and 62. The four groups of four constellation points are further partitioned into an 8-way partition of the 16 QAM constellation points, comprising eight groups of two points. These are groups 64, 66, 68, 70, 72, 74, 76, and 78. The present invention uses the 8-way partition to encode symbols for transmission. In coding with an 8-way partition, the transmitted symbols represent four bits consisting of a convolutionally encoded one-of-eight group, and an uncoded bit within the group. As indicated above, the receiver decodes the stream of convolutionally encoded groups into two decoded bits and one sliced bit per received symbol.

The groups of the 8-way partition illustrated in FIG. 3 are each identified by a three-bit binary label. The first set of branch metrics indicates the likelihood of a particular value of the two most significant bits of the group at the decoder, and the second set of branch metrics indicates the likelihood of the least significant bit of the group being a zero or a one at the decoder. For purposes of explanation of the coding scheme, the eight groups are also identified by one of the letters A to H. The identification of each of the groups by the three-bit binary codes and letters is shown in Table 1.

TABLE 1

| Group | Binary Code | Letter |
|---|---|---|
| 64 | 000 | A |
| 66 | 111 | H |
| 68 | 110 | G |
| 70 | 001 | B |
| 72 | 010 | C |
| 74 | 101 | F |
| 76 | 100 | E |
| 78 | 011 | D |

The assignment of the letters A-H to each of the groups is based on the decimal equivalent of the binary code for the groups. Thus, letter A corresponds to the decimal equivalent 0 of binary code 000. Letter B corresponds to the decimal equivalent 1 of binary code 001. Letter C corresponds to the decimal equivalent 2 of binary code 010. Similarly, each of letters D-H are assigned to decimal equivalents 3-7, respectively, of their assigned groups.

At the decoder, the minimum distances of a received point to the sets A∪B, H∪G, C∪D, and F∪E are defined by the first set of branch metrics. The minimum distance to a set means the distance to the closest member of that set.

Figure 4:
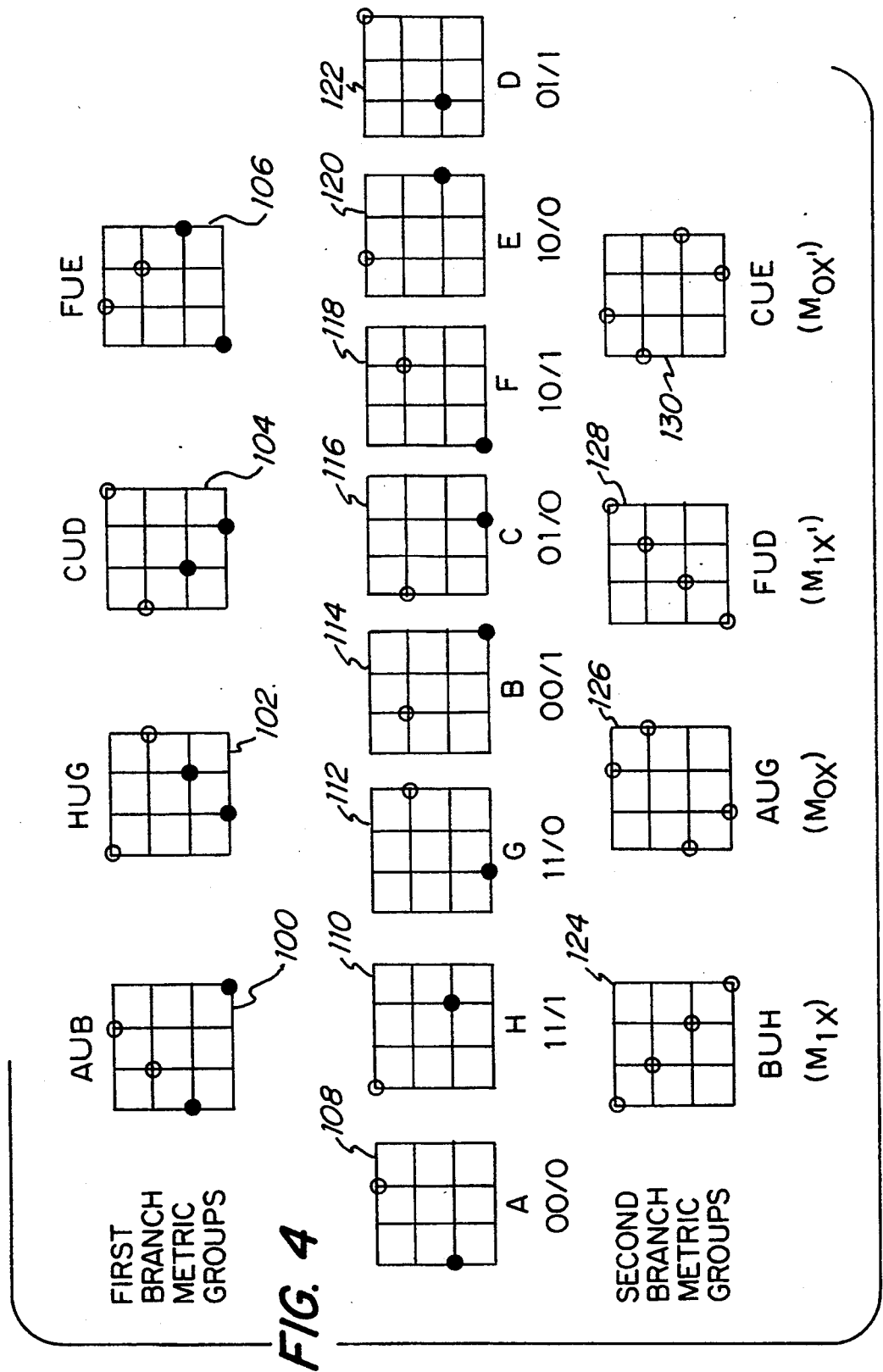
FIG. 4 is a graphic representation of constellation point groups used in the computation of first and second sets of branch metrics for each received symbol.

FIG. 4 illustrates the subsets of constellation points used to generate the branch metrics at the decoder. As indicated above, the eight groups A-H in the partition of FIG. 3 are labelled with three-bit binary numbers 000-111 ("A-H"). These three-bit binary numbers satisfy the following criteria:

"000" is chosen arbitrarily from the eight groups.

The group with minimum distance $2\Delta_0$ from A is labeled "111".

The two groups with minimum distance $\sqrt{2}\Delta_0$ from A are labeled "001" and "110".

One of the remaining four groups is labeled "010".

The group with minimum distance $2\Delta_0$ from C is labeled "101".

The two remaining groups are labeled "100" and "011".

Since the:

two MSBs of A,B=00
two MSBs of G,H=11
two MSBs of C,D=01
two MSBs of E,F=10 then, the first set of branch metrics can be expressed as:

$BM_{00}$=minimum (distances from RX to A∪B)
$BM_{11}$=minimum (distances from RX to H∪G)
$BM_{01}$=minimum (distances from RX to C∪D)
$BM_{10}$=minimum (distances from RX to E∪F)

where ∪ denotes set union and RX designates a received signal.

The set unions noted for use in generating the first branch metrics are illustrated in FIG. 4. In particular, the union of sets A and B is illustrated at group 100. The union of sets G and H is illustrated at group 102. The union of sets C and D is illustrated at group 104. The union of sets E and F is illustrated at group 106. These unions constitute the graphical superimposition of the appropriate individual groups A-H illustrated at 108, 110, 112, 114, 116, 118, 120, and 122.

The second set of branch metrics reflect the parity of the received group. Referring to the trellis diagram of FIG. 5, odd groups (001, 011, 101, 111) encode 1X branches and even groups (000, 010, 100, 110) encode 0X branches. The bottom row of FIG. 4 illustrates the groups used to compute the second set of branch metrics for each received symbol. The subsets 124, 126, 128 and 130 are derived as follows:

$M_{ox}$=union of sets from A, H, G, B whose corresponding binary labels a, h, g, b are EVEN (i.e., A∪G)

$M_{ox'}$=union of sets from C, F, E, D whose corresponding binary labels c, f, e, d are EVEN (i.e., C∪E)

$M_{1x}$=union of sets from A, H, G, B whose corresponding binary labels a, h, g, b are ODD (i.e, H∪B)

$M_{1x'}$=union of sets from C, F, E, D whose corresponding binary labels c, f, e, d are ODD (i.e., F∪D).

The branch metrics are then defined as:

$BM_{ox}$=minimum (distances from RX to points of $M_{ox}$)

$BM_{ox'}$=minimum (distances from RX to points of $M_{ox'}$)

$BM_{1x}$=minimum (distances from RX to points of $M_{1x}$)

$BM_{1x'}$ = minimum (distances from RX to points of $M_{1x'}$)

When supplied with the branch metrics computed as described above, the Viterbi decoder of FIG. 2 will recover the original source bits from the received symbols, despite the error producing effects of noise in the transmission channel.

The Viterbi decoding algorithm is a very practical optimal decoding technique that was first published in 1967. See, e.g., A. J. Viterbi, "Error Bounds for Convolutional Codes and an Asymptotically Optimum Decoding Algorithm," *IEEE Trans. Information Theory*, Vol. IT-13, pp. 260-269, April 1967 and G. D. Forney, Jr., "The Viterbi Algorithm," *Proc. of the IEEE*, Vol. 61, pp. 268-278, March 1973. The algorithm assumes that the optimum signal paths from the infinite past to all trellis states at time n are known. The algorithm then extends these paths iteratively from the states at time n to the states of time n+1 by choosing one best path to each new state as a "survivor" and forgetting all other paths that cannot be extended as the best paths to the new states. Looking backwards in time, the surviving paths tends to merge into the same "history path" at some time n−d. With a sufficient decoding delay D such that the randomly changing value of d is highly likely to be smaller than D, the information associated with a transition on the common history path at time n−D can be selected for output.

The operations of the Viterbi decoder are not complex. A decoding step involves only the determination of the branch metrics, the total accumulated metric and the pair wise comparison and proper path selection. These operations are identical from level to level, and as they must be performed at every state, the complexity of the decoder is proportional to the number of states, and grows exponentially with the constraint length. An example of a rate ½ punctured trellis 150 in accordance with the present invention is illustrated in FIG. 5. Stepping through the trellis, the first set of branch metrics is input to the decoder to effect the transitions between time 1 and time 2. From time 2 to 3, the second set of branch metrics are input to the decoder to effect the second pass through the trellis for a received symbol.

Figure 6:
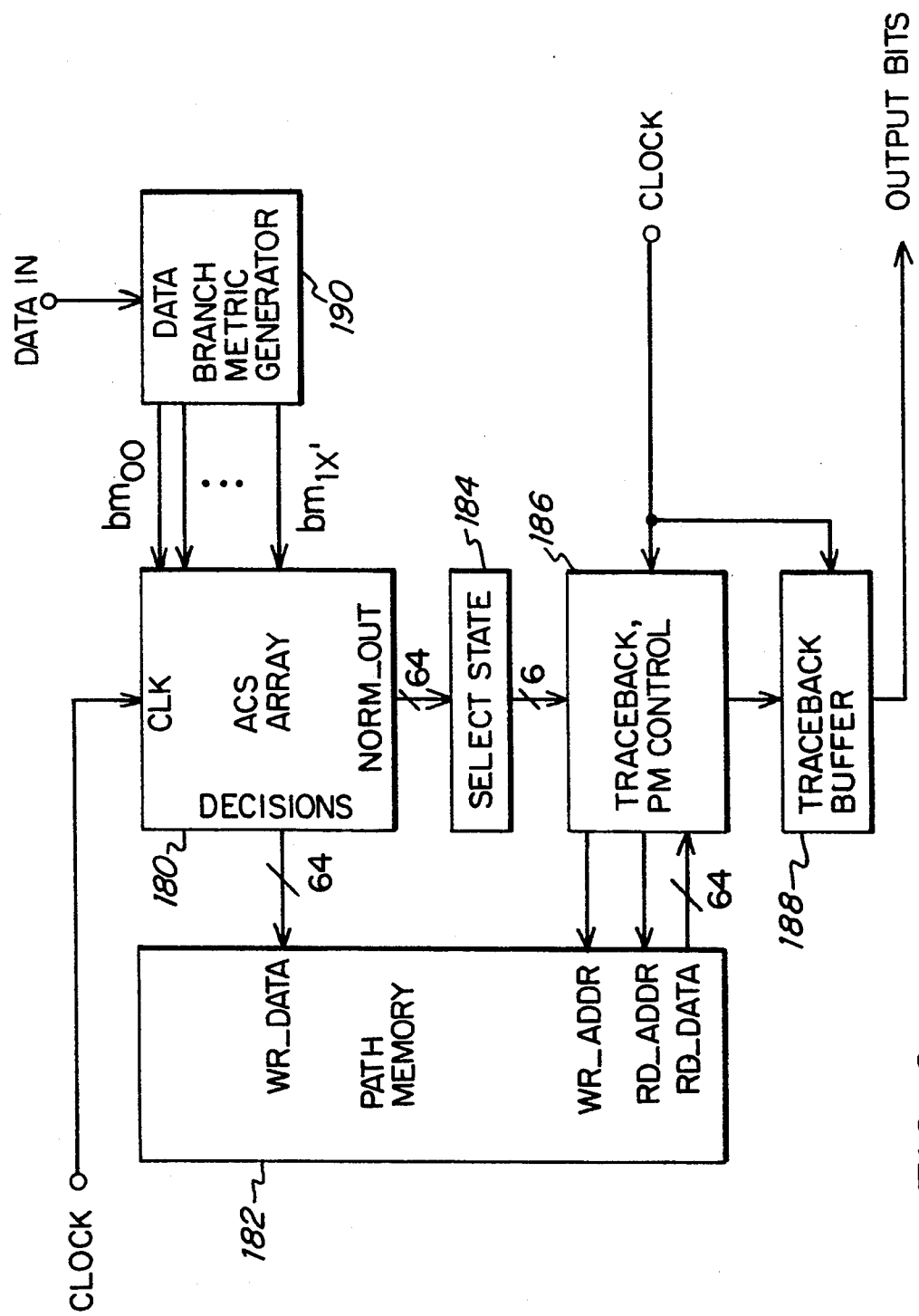
FIG. 6 is a block diagram illustrating a Viterbi decoder that is implemented using a plurality of add compare select ("ACS") modules provided in an ACS array.

An implementation of a Viterbi decoder is illustrated in block diagram form in FIG. 6. An array 180 of add compare select (ACS) pairs is used to carry out the Viterbi algorithm. ACS array 180 interconnects $2^{k-1}$ ACS units that compute the survivor paths and their associated metrics that enter each node in the trellis. The notation "k" represents the number of shift register stages provided in the convolutional encoder that is used to produce the transmitted symbols. The survivor paths are stored in a path memory 182 and their path metrics are stored with their associated node as "state metrics" in the ACS array 180. The output of each ACS unit is a one bit result indicating which previous node (odd/even) the survivor path came from, and a normalization bit that indicates if all state metrics may be reduced uniformly by an offset to prevent saturation.

Figure 7:
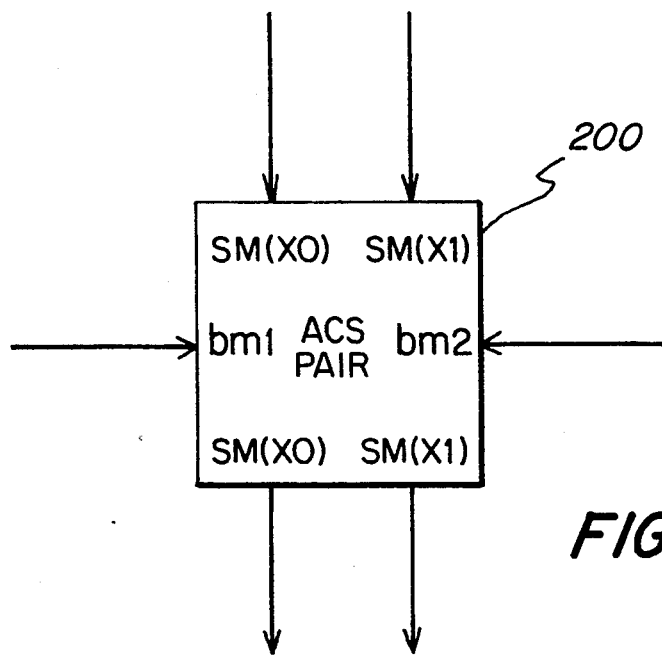
FIG. 7 is a block diagram showing the inputs to and the outputs from an ACS pair used in the ACS array of FIG. 6.
Figure 8:
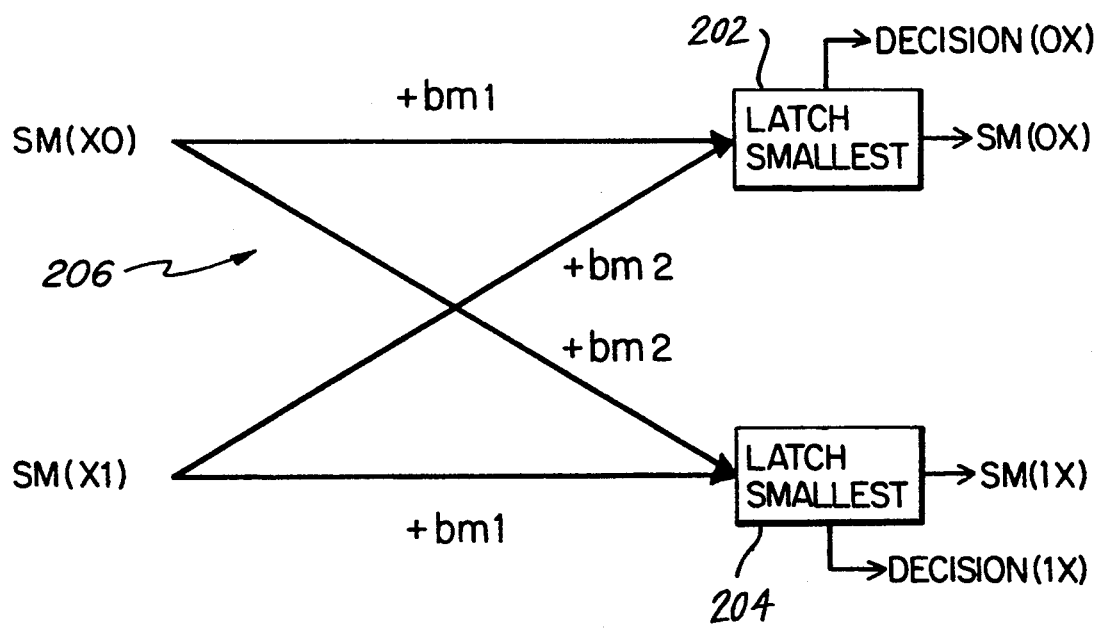
FIG. 8 is a block diagram illustrating the internal operation of the ACS pair illustrated in FIG. 7.

FIG. 7 illustrates the inputs and outputs to an individual ACS pair 200 contained in ACS array 180. FIG. 8 is a diagrammatic representation of the operation of each ACS pair 200. The determination of survivor paths, and their storage in the path memory is described by the basic ACS array computation, represented by the "butterfly" generally designated 206 in FIG. 8. For any partial state X, the notation "X0" is referred to as the "even" state and "X1" is referred to as the "odd" state.

The butterfly 206 shows that the two candidate paths that enter node 0X are paths from the even state X0 and the odd state X1 with branch metrics bm1 and bm2, respectively. Likewise, the even and odd paths also enter the node 1X with branch metrics bm2 and bm1, respectively. From this description, it is seen that it is sufficient to store even/odd information to describe a survivor path's progress through the trellis. The candidate paths input to the compare, select nodes 202, 204 are computed as the sum of the entering state metric and their associated branch metrics. The survivor path is chosen as the smallest of the candidate paths, and the survivor path metric is latched as the new state metric. The decision from which node (even/odd) the survivor path comes from is output from the ACS and stored in path memory 182.

Turning back to FIG. 6, the ACS pairs are interconnected in the ACS array 180, with each ACS pair connected to two branch metric and two state metric inputs. The branch metric inputs are received from branch metric generator 190, which generates the first and second sets of branch metrics in accordance with the partitioning illustrated in FIG. 4. Traceback, path metric control circuitry 186 and trackback buffer 188 are conventional Viterbi decoder components that keep track of the history path for a succession of received symbols. The decoded bits are output from traceback buffer 188 in a conventional manner. The path memory 182 stores the decisions output from the ACS array, and contains the information required by the traceback circuit to reconstruct the survivor paths.

Figure 9:
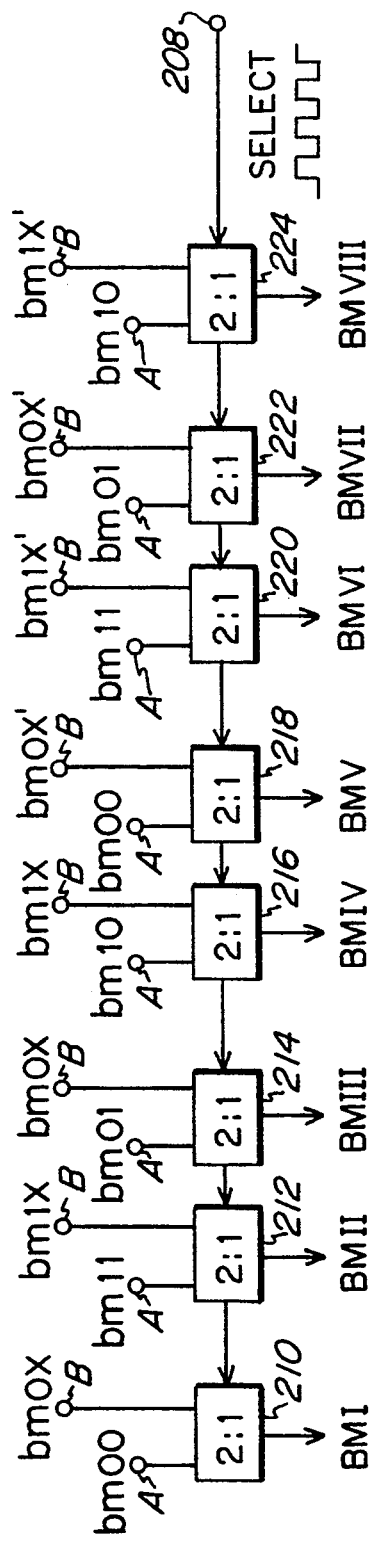
FIG. 9 is a block diagram illustrating a plurality of two pole solid-state switches for use in selectively outputting branch metrics to the ACS array.
Figure 10:
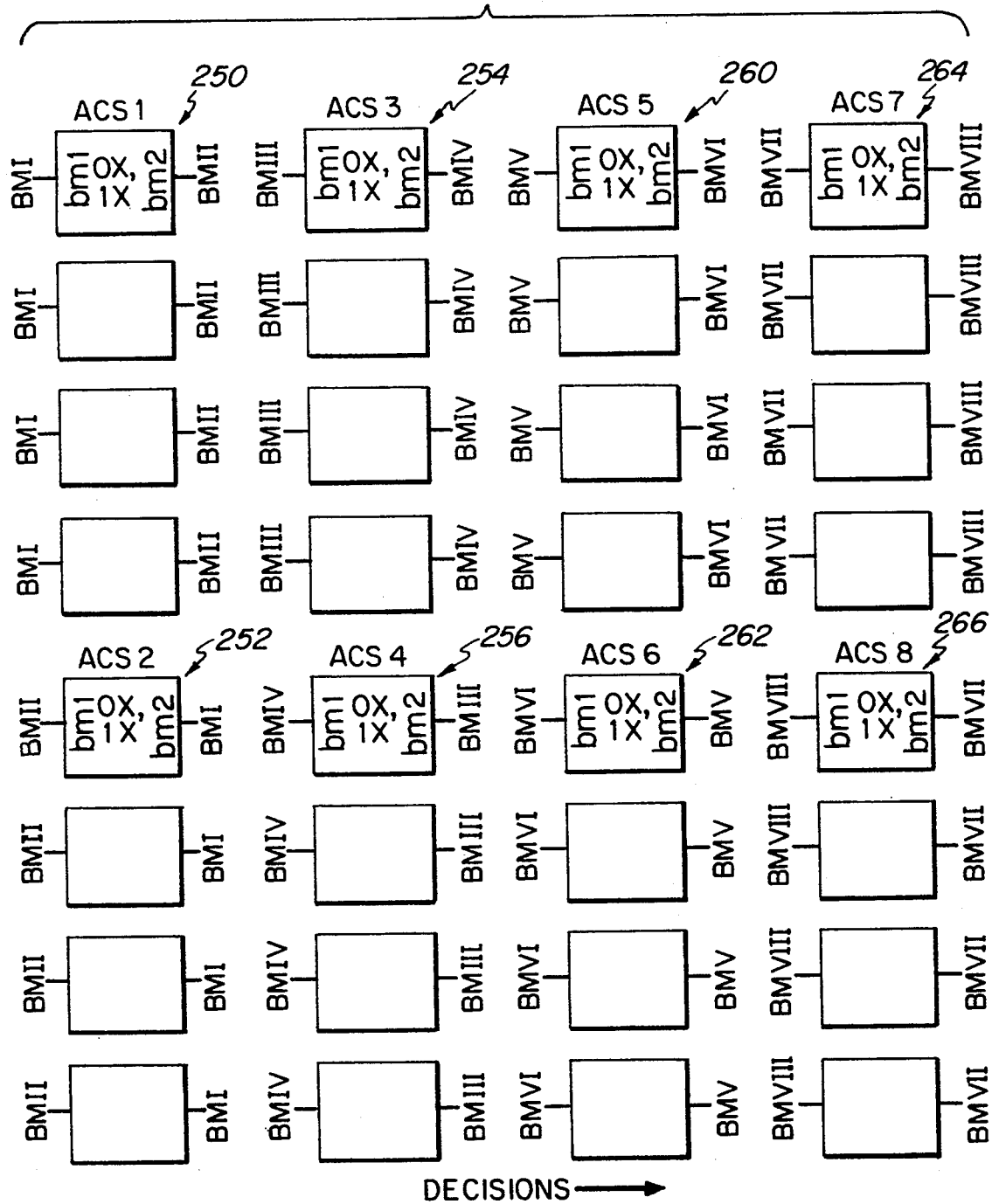
FIG. 10 is a detailed block diagram illustrating the layout of an ACS array and a mathematical representation of its connections in accordance with the present invention.

A detailed, generalized embodiment of the ACS array 180 is illustrated in FIGS. 9 and 10. FIG. 9 illustrates the selection circuitry for coupling the appropriate branch metrics to the ACS pairs for each of the first and second passes through the decoder. A select signal is input via terminal 208 to each of solid-state switches 210, 212, 214, 216, 218, 220, 222, and 224. When the select signal is high, each solid-state switch will output the branch metric input to its terminal A. When the select signal is low, each solid-state switch will output the branch metric input to its terminal B. The branch metrics output from solid-state switch 210 are designated BMI. The branch metrics output from switches 212 to 224 are designated BMII to BMVIII, respectively.

FIG. 10 illustrates the ACS array, containing eight banks of four ACS pairs. Bank 250 (ACS 1), receives the branch metrics output from solid-state switches 210 (BMI), 212 (BMII), 214 (BMIII), and 216 (BMIV) as indicated. Banks 252 (ACS 2), 254 (ACS 3), 256 (ACS 4), 260 (ACS 5), 262 (ACS 6),.264 (ACS 7), and 266 (ACS 8) contain identical ACS pairs, coupled to receive the branch metrics as indicated. The three lower ACS pairs in each of banks 260, 262, 264 and 266 have their inputs coupled identically with the inputs of the top ACS pair in the respective bank. For simplicity, the state metric interconnections are not shown. They would be as illustrated in the ACS pair of FIG. 7.

The organization of the ACS banks is expressed mathematically by the following equations:

ACS 1: all X such that f(0X0)=00 and
g0(X00)=g1(X00)

ACS 2: all X such that f(0X0)=11 and
g0(X00)=g1(X00)

ACS 3: all X such that f(0X0)=01 and
g0(X00)=g1(X00)

ACS 4: all X such that f(0X0)=10 and
g0(X00)=g1(X00)

ACS 5: all X such that f(0X0)=00 and
g0(X00)!=g1(X00)

ACS 6: all X such that f(0X0)=11 and
g0(X00)!=g1(X00)

ACS 7: all X such that f(0X0)=01 and
g0(X00)!=g1(X00)

ACS 8: all X such that f(0X0)=10 and
g0(X00)!=g1(X00)

Each of the eight banks of ACS units is composed of the states 0X, 1X that satisfy the classifying equations. In this notation, X is a $\nu-1$ bit binary number, and 0X indicates a $\nu$-bit number with 0MSB, X1 indicating a $\nu$-bit number$=2*X+1$, etc.

For example, bank 250 (ACS 1) consists of the sets of ACS units $\{X, 2^\nu+X\} \, \forall \, 0 \leq X < 2^{\nu-1}$, such that:

$$f(\vec{O}|\vec{X}|\vec{O}) = \begin{bmatrix} o \\ o \end{bmatrix}$$

and $$g0(\vec{X}|I_1|I_1) \neq g1(\vec{X}|I_1|I_1)$$

where $\vec{X}$ is a 1 by $(\nu-1)$ row vector whose elements are taken from the binary representation of X. That is:

$$\vec{X}=[X_{\nu-2}, X_{\nu-1}, \ldots X_1, X_o]$$

and $$X_0 = LSB \text{ of } X \text{ base } 2$$
$$X_1 = 2\text{'s of } X \text{ base } 2$$
$$X_2 = 4\text{'s of } X \text{ base } 2$$
$$\vdots$$
$$X_{\nu-2} = MSB \text{ of } X \text{ base } 2$$

and $I_1=[1]$ ($|X|$ identity matrix)

$\vec{O}=[o]$ ($1 \times 1$ null matrix).

In designing the system of the present invention, code branches were assigned to symbols in order to try to maximize Euclidean distance properties of the code.

Error events of the code, which are erroneous paths first diverging and then re-merging with the correct path, determine the error correcting capability of the code. The error events need only to be considered as paths from the all-zero path since the convolutional code is linear, and Euclidean distances between branches are invariant to exclusive-or'ing of their binary labels by a constant. The mapping of 3-bit branches to the QAM symbols in FIG. 4 was designed along with the punctured rate ⅔ code, to map a Euclidean distance of $\sqrt{2}\Delta_0$ between diverging paths at each node in the trellis. Furthermore, the distances, or metrics, computed in the first and second phases were designed to be orthogonal to each other. Distances between unions A∪B and H∪G lie along the line $y=-x$, while distances between B∪H and A∪G lie along $y=x$.

In the unpunctured phase of the trellis, the two branches leaving each node are designed by the punctured convolutional code to be complements, as in the simple trellis of FIG. 5. In order to map $\sqrt{2}\Delta_0$ between these diverging branches, points A∪B are assigned to branch 00, and H∪G are assigned to 11. The distance between the points of the two sets is $\sqrt{2}\Delta_0$. Similarly, branches 01 and 10 are mapped to points C∪D and F∪E respectively.

In the punctured phase, complementary branches 1X and 0X enter each node. The encoded branch is used as the LSB along with the two MSBs generated by the previous unpunctured branch to specify the transmitted group A–H. The uncoded bit chooses which of the two bits in the group to transmit. The uncoded mapping is unimportant as long as it is sliced in a consistent manner in the decoder.

The Euclidean distance between the punctured phase branches is also $\sqrt{2}\Delta_0$. A punctured branch emerging from a node with entering branches 00 and 11 is compared to B∪H for metric BM1x, and A∪G for BMox. The distance between points of these two groups is $\sqrt{2}\Delta_0$. Similarly, a punctured branch emerging from a node with entering branches 01 and 10 use F∪D and C∪E for computation of BM1x' and BMox' respectively.

The punctured rate-⅔ convolutional code used in the present invention is important for both optimal error-correcting performance and simplicity of ACS array implementation. The convolutional code is similar in structure to those published by J. B. Cain, G. C. Clark, Jr. and J. M. Geist in "Punctured Convolutional Codes of Rate (n−1)/n and Simplified Maximum Likelihood Decoding," *IEEE Trans. Info. Theory*, Vol. IT-25, pp. 97–100, January 1979. Only two different code generators are used, allowing the implementation of the present punctured rate ⅔ code using a base rate ½ code. The code generators G0 and G1 are also restricted to having their two LSBs equal, allowing the simple ACS array layout in FIG. 10. With the symbol mapping of FIG. 4, a $\nu=6$ optimal code G1=145, G0=155 was found based on the simplifying assumption that the two metrics in the punctured and unpunctured phases are orthogonal and separable and performing an exhaustive search as described in G. Ungerboeck, "Trellis-Coded Modulation with Redundant Signal Stes—Part I: Introduction,—Part II: State of the Art," *IEEE Communications Magazine*, Vol 25, No. 2.

The asymptotic coding gain of the present invention can be computed using the above assumption of orthogonal and separable branch metrics. The smallest error event has squared Euclidean distance $7(\Delta_0)^2$, and accounting for the 3 dB loss due to doubling the constellation, the coding gain is 10 log 7−3 dB=5.45 dB.

It should now be appreciated that the present invention provides a method and apparatus for communicating digital data using trellis coded QAM implemented with punctured convolutional codes. Trellis coding is efficiently implemented using an 8-way constellation partitioning. This partitioning can provide up to 6 dB of coding gain since the spacing between the uncoded bits is $2\sqrt{2}\Delta_0$. A rate ⅔ convolutional code is implemented using a punctured rate ½ code. The system of the present invention can increase the effective transmission range of digital data, for example, high definition television terrestrial broadcast data, and significantly simplify the implementation of a conventional trellis code. The coding technique also reduces bit errors by a substantial factor.

Although the invention has been described in connection with a specific embodiment thereof, those skilled in the art will appreciate that numerous adaptations and modifications may be made thereto without departing from the spirit and scope of the invention as set forth in the claims.

What is claimed is:

1. A method for communicating digital data using trellis coded QAM comprising the steps of:
    coding symbols for transmission using a rate ½ convolutional encoder punctured to rate ⅔;
    transmitting the coded symbols;
    receiving the transmitted coded symbols at a receiver;
    computing two sets of branch metrics for each received symbol; and
    decoding the received symbols by using said branch metrics to effect two passes through a rate ½ Viterbi decoder for each symbol.

2. A method in accordance with claim 1 wherein said symbols are coded on the basis of groups forming an 8-way partition of a QAM constellation.

3. A method in accordance with claim 2 comprising the further step of identifying an uncoded bit from each symbol by the position of a transmitted constellation point within a group.

4. A method in accordance with claim 2 wherein said symbols are coded on the basis of groups of different two-point subsets of a 16 QAM constellation and the two points in each group are separated by a distance of $2\sqrt{2}\Delta_0$, where $\Delta_0$ is the spacing between adjacent points in said 16 QAM constellation.

5. A method in accordance with claim 1 wherein:
    said received symbols define received points that correspond to but may be offset from transmitted QAM constellation points due to transmission errors;
    said first set of branch metrics indicates the distances between a received point and the closest actual QAM constellation point in each of a first plurality of predetermined subsets of said constellation points; and
    said second set of branch metrics indicates the distances between said received point and the closest actual QAM constellation point in each of a second plurality of predetermined subsets of said constellation points.

6. A method in accordance with claim 5 wherein:
    said symbols are coded on the basis of eight different groups of constellation points that form an 8-way partition of a QAM constellation;
    each group is labeled with a 3-bit binary number on the basis of the distances between points of the groups;
    a first group A is identifiable by a 3-bit binary number that is bitwise complementary to that of a second group H whose points are separated by $2\Delta_0$ from points in group A;
    a third group B whose points are separated by $\sqrt{2}\Delta_0$ from points in group A is identifiable by a 3-bit label which is the bit-wise exclusive-or of the label of A with 001;
    a fourth group G whose points are separated by $2\Delta_0$ from points in group B is identifiable by a 3-bit binary number that is bitwise complementary to the label of B;
    a fifth group C is identifiable by a 3-bit binary number that is the bitwise exclusive-or of the label of A with 010;
    a sixth group F whose points are separated by $2\Delta_0$ from points in group C is identifiable by a 3-bit binary number that is bitwise complementary to the label of C;
    a seventh group D whose points are separated by $\sqrt{2}\Delta_0$ from points in group C is identifiable by a 3-bit label which is the bit-wise exlcusive-or of the label of C with 001;
    an eighth group E whose points are separated by $2\Delta_0$ from points in group D is identifiable by a 3-bit binary number that is bitwise complementary to the label of D;
    wherein $\Delta_0$ is the minimum distance between points in said QAM constellation; and
    said first plurality of predetermined subsets comprise the unions of groups AUB, HUG, CUD, and FUE; and
    said second plurality of predetermined subsets comprise the unions of groups AUG, CUE, HUB, and FUD.

7. A method for decoding received convolutionally encoded symbols comprising the steps of:
    computing two sets of branch metrics for each received symbol; and
    decoding the received symbols by using said branch metrics to effect two passes through a rate ½ Viterbi decoder for each symbol.

8. A method in accordance with claim 7 wherein said received symbols are coded on the basis of groups forming an 8-way partition of a QAM constellation.

9. A method in accordance with claim 8 comprising the further step of identifying an uncoded bit from each received symbol by determining the position of a transmitted constellation point within a group.

10. A method in accordance with claim 7 wherein:
    said received symbols define received points that correspond to but may be offset from transmitted QAM constellation points due to transmission errors;
    said first set of branch metrics indicates the distances between a received point and the closest actual QAM constellation point in each of a first plurality of predetermined subsets of said constellation points; and
    said second set of branch metrics indicates the distances between said received point and the closest actual QAM constellation point in each of a second plurality of predetermined subsets of said constellation points.

11. A method in accordance with claim 10 wherein:
    said symbols are coded on the basis of eight different groups of constellation points that form an 8-way partition of a QAM constellation partition;
    each group is labeled with a 3-bit binary number on the basis of the distances between points of the groups;
    a first group A is identifiable by a 3-bit binary number that is bitwise complementary to that of a second group H whose points are separated by $2\Delta_0$ from points in group A;
    a third group B whose points are separated by $\sqrt{2}\Delta_0$ from points in group A is identifiable by a 3-bit label which is the bit-wise exclusive-or of the label of A with 001;

a fourth group G whose points are separated by $2\Delta_0$ from points in group B is identifiable by a 3-bit binary number that is bitwise complementary to the label of B;

a fifth group C is identifiable by a 3-bit binary number that is the bitwise exclusive-or of the label of A with 010;

a sixth group F whose points are separated by $2\Delta_0$ from points in group C is identifiable by a 3-bit binary number that is bitwise complementary to the label of C;

a seventh group D whose points are separated by $\sqrt{2}\Delta_0$ from points in group C is identifiable by a 3-bit label which is the bit-wise exlcusive-or of the label of C with 001;

an eighth group E whose points are separated by $2\Delta_0$ from points in group D is identifiable by a 3-bit binary number that is bitwise complementary to the label of D;

wherein $\Delta_0$ is the minimum distance between points in said QAM constellation; and said first plurality of predetermined subsets comprise the unions of groups A∪B, H∪G, C∪D, and F∪E; and said second plurality of predetermined subsets comprise the unions of groups A∪G, C∪E, H∪B, and F∪D.

12. Apparatus for encoding digital QAM data for communication to a receiver comprising:
means for coding symbols representative of QAM constellation points for transmission using a rate $\frac{2}{3}$ code provided by a rate $\frac{1}{2}$ convolutional encoder having a trellis with alternating branches punctured to form said rate $\frac{2}{3}$ code; and
means for transmitting the coded symbols provided by said coding means;
wherein said symbols are coded on the basis of groups forming an 8-way partition of a QAM constellation and each require the computation of two sets of branch metrics and two passes through said trellis for decoding.

13. Apparatus for decoding the symbols transmitted from the encoder of claim 12 comprising:
means for receiving the transmitted coded symbols;
means operatively associated with said receiving means for computing two sets of branch metrics for each received symbol; and
means for decoding the received symbols by using said branch metrics to effect two passes through a rate $\frac{1}{2}$ Viterbi decoder for each symbol.

14. Apparatus in accordance with claim 12 wherein:
an uncoded bit is communicated within each symbol by the position of a transmitted constellation point within a group.

15. Apparatus in accordance with claim 12 wherein said symbols are coded on the basis of groups of different two-point subsets of a 16 QAM constellation and the two points in each group are separated by a distance of $2\sqrt{2}\Delta_0$, where $\Delta_0$ is the spacing between adjacent points in said 16 QAM constellation.

16. Apparatus in accordance with claim 13 wherein:
said received symbols define received points that correspond to but may be offset from transmitted QAM constellation points due to transmission errors;

said first set of branch metrics indicates the distances between a received point and the closest actual QAM constellation point in each of a first plurality of predetermined subsets of said constellation points; and said second set of branch metrics indicates the distances between said received point and the closest actual QAM constellation point in each of a second plurality of predetermined subsets of said constellation points.

17. Apparatus for decoding received convolutionally encoded symbols comprising:
means for computing two sets of branch metrics for each received symbol; and
means responsive to said branch metrics for decoding the received symbols by effecting a first pass through a rate $\frac{1}{2}$ Viterbi decoder for each symbol in accordance with the first set of branch metrics for the symbol and a second pass through said decoder for each symbol in accordance with the second set of branch metrics for the symbol.

18. Apparatus in accordance with claim 17 wherein said received symbols are coded on the basis of groups forming an 8-way partition of a QAM constellation.

19. Apparatus in accordance with claim 18 wherein:
an uncoded bit is communicated within each received symbol by the position within a group of a transmitted constellation point represented by the symbol.

20. Apparatus in accordance with claim 17 wherein:
said received symbols define received points that correspond to but may be offset from transmitted QAM constellation points due to transmission errors;
said first set of branch metrics indicates the distances between a received point and the closest actual QAM constellation point in each of a first plurality of predetermined subsets of said constellation points; and
said second set of branch metrics indicates the distances between said received point and the closest actual QAM constellation point in each of a second plurality of predetermined subsets of said constellation points.

21. Apparatus in accordance with claim 20 wherein:
said symbols are coded on the basis of eight different groups of constellation points forming an 8-way partition of a QAM constellation;
each group is labeled with a 3-bit binary number on the basis of the distances between points of the groups;
a first group A is identifiable by a 3-bit binary number that is bitwise complementary to that of a second group H whose points are separated by $2\Delta_0$ from points in group A;
a third group B whose points are separated by $\sqrt{2}\Delta_0$ from points in group A is identifiable by a 3-bit label which is the bit-wise exclusive-or of the label of A with 001;
a fourth group G whose points are separated by $2\Delta_0$ from points in group B is identifiable by a 3-bit binary number that is bitwise complementary to the label of B;
a fifth group C is identifiable by a 3-bit binary number that is the bitwise exclusive-or of the label of A with 010;
a sixth group F whose points are separated by $2\Delta_0$ from points in group C is identifiable by a 3-bit binary number that is bitwise complementary to the label of C;

a seventh group D whose points are separated by $\sqrt{2}\Delta_0$ from points in group C is identifiable by a 3-bit label which is the bit-wise exclusive-or of the label of C with 001;

an eighth group E whose points are separated by $2\Delta_0$ from points in group D is identifiable by a 3-bit binary number that is bitwise complementary to the label of D;

wherein $\Delta_0$ is the minimum distance between points in said QAM constellation; and said first plurality of predetermined subsets comprise the unions of groups A∪B, H∪G, C∪D, and F∪E; and said second plurality of predetermined subsets comprise the unions of groups A∪G, C∪E, H∪B, and F∪D.

* * * * *